United States Patent [19]

Cherian

[11] 4,393,581

[45] Jul. 19, 1983

[54] METHOD OF FORMING LEADS ON A LEAD FRAME

[75] Inventor: Gabriel B. Cherian, York, Pa.

[73] Assignee: AMP Incorporated, Harrisburg, Pa.

[21] Appl. No.: 308,221

[22] Filed: Oct. 5, 1981

Related U.S. Application Data

[63] Continuation of Ser. No. 114,451, Jan. 22, 1980, abandoned.

[51] Int. Cl.³ .............................................. H01R 43/00
[52] U.S. Cl. ................................. 29/827; 339/17 CF; 29/874
[58] Field of Search ........................ 29/827, 838, 577; 113/119; 339/17 C, 17 CF, 17 L; 357/70

[56] References Cited

U.S. PATENT DOCUMENTS

| | | | |
|---|---|---|---|
| 3,416,348 | 12/1968 | Carter, Jr. et al. | 29/838 X |
| 3,614,546 | 10/1971 | Avins | 29/577 X |
| 4,217,020 | 8/1980 | Holland | 339/17 C X |

Primary Examiner—Carl E. Hall
Assistant Examiner—Carl J. Arbes
Attorney, Agent, or Firm—Allan B. Osborne

[57] ABSTRACT

The present invention relates to a chip carrier wherein the leads therefrom are formed into a closely spaced pattern. More particularly, the invention discloses the method of stamping and forming the leads to achieve a high density arrangement.

3 Claims, 4 Drawing Figures

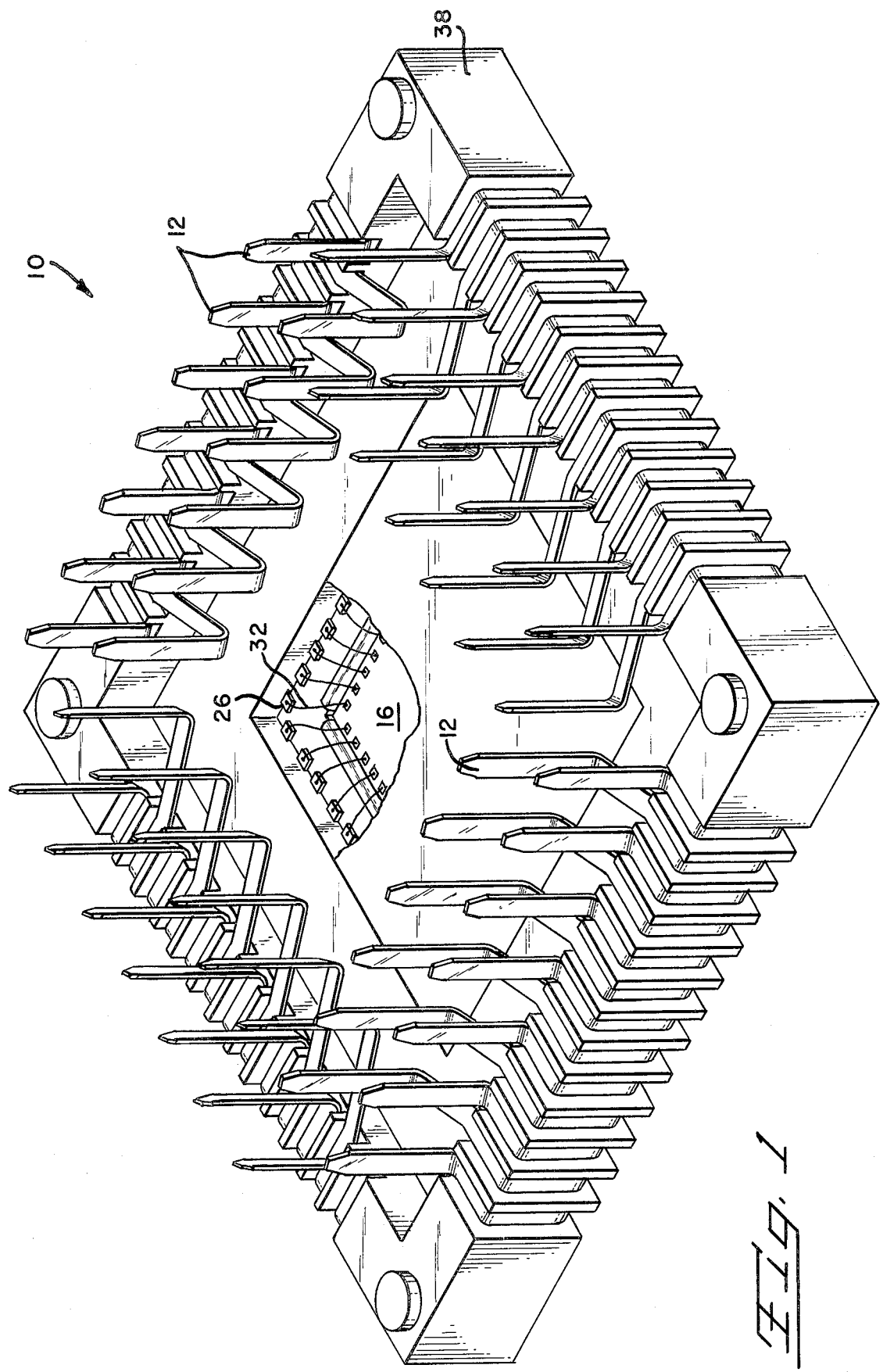

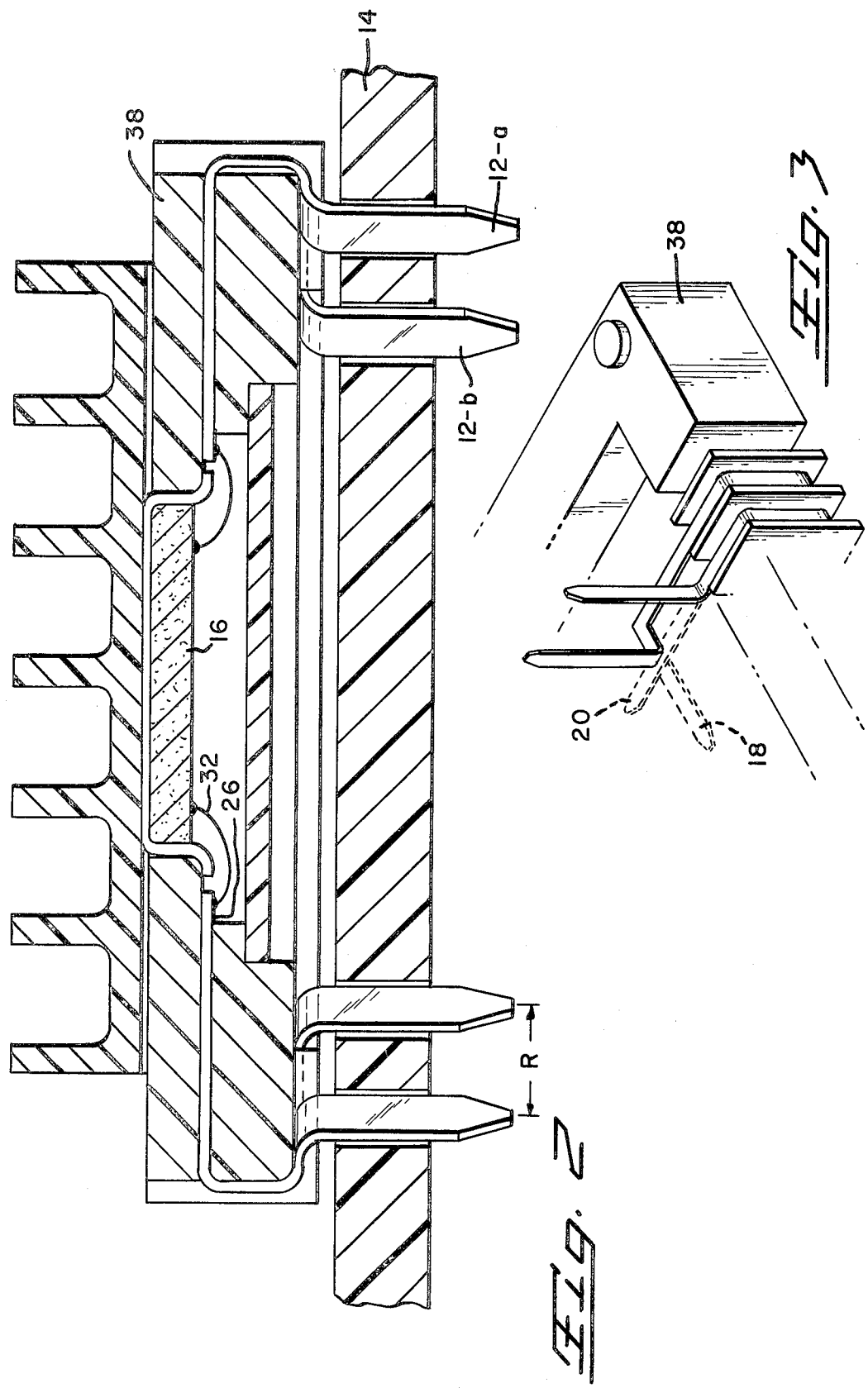

METHOD OF FORMING LEADS ON A LEAD FRAME

This is a continuation of application Ser. No. 114,451 filed Jan. 22, 1980 now abandoned.

BACKGROUND OF THE INVENTION

1. Field of the Invention

This invention relates to a method of forming stamped leads on a device to be plugged into a printed circuit board.

2. Prior Art

Components which are attached in one manner or the other to a printed circuit board achieve the attachment by means of leads which either extend outward from a lead frame on which a chip may be positioned, or a plurality of leads, each an integral part of a contact member. In either case, the number of leads was small enough to meet the physical dimensions on the board; i.e., the circuits on the board were not crowded. The problem now facing component designers is the greater functions being packed into a chip and the correspondingly greater number of leads coming out of the package which is no larger than the earlier developed chip packages. This means that the density of circuits and holes on the boards must be increased within the same area of the board. The board manufacturers resolved the problem in at least one manner by placing holes behind one another with the circuits weaving in between. The lead frame designers and manufacturers, however, had the problem of forming the leads to fit the new high density problem.

SUMMARY OF THE INVENTION

The present invention relates to a method of stamping and forming leads on a lead frame so that two rows of legs on the leads per side are provided without the leads or legs from either row interfering with the leads or legs from the parallel row.

BRIEF DESCRIPTION OF THE DRAWINGS

FIG. 1 is a perspective view of a pre-molded chip package having leads formed in accordance with the method of the present invention;

FIG. 2 is a view of the chip package of FIG. 1 shown plugged into the circuit board;

FIG. 3 is a view showing the dilemma of trying to form leads by the prior art methods.

DESCRIPTION OF THE INVENTION

Figure 4:
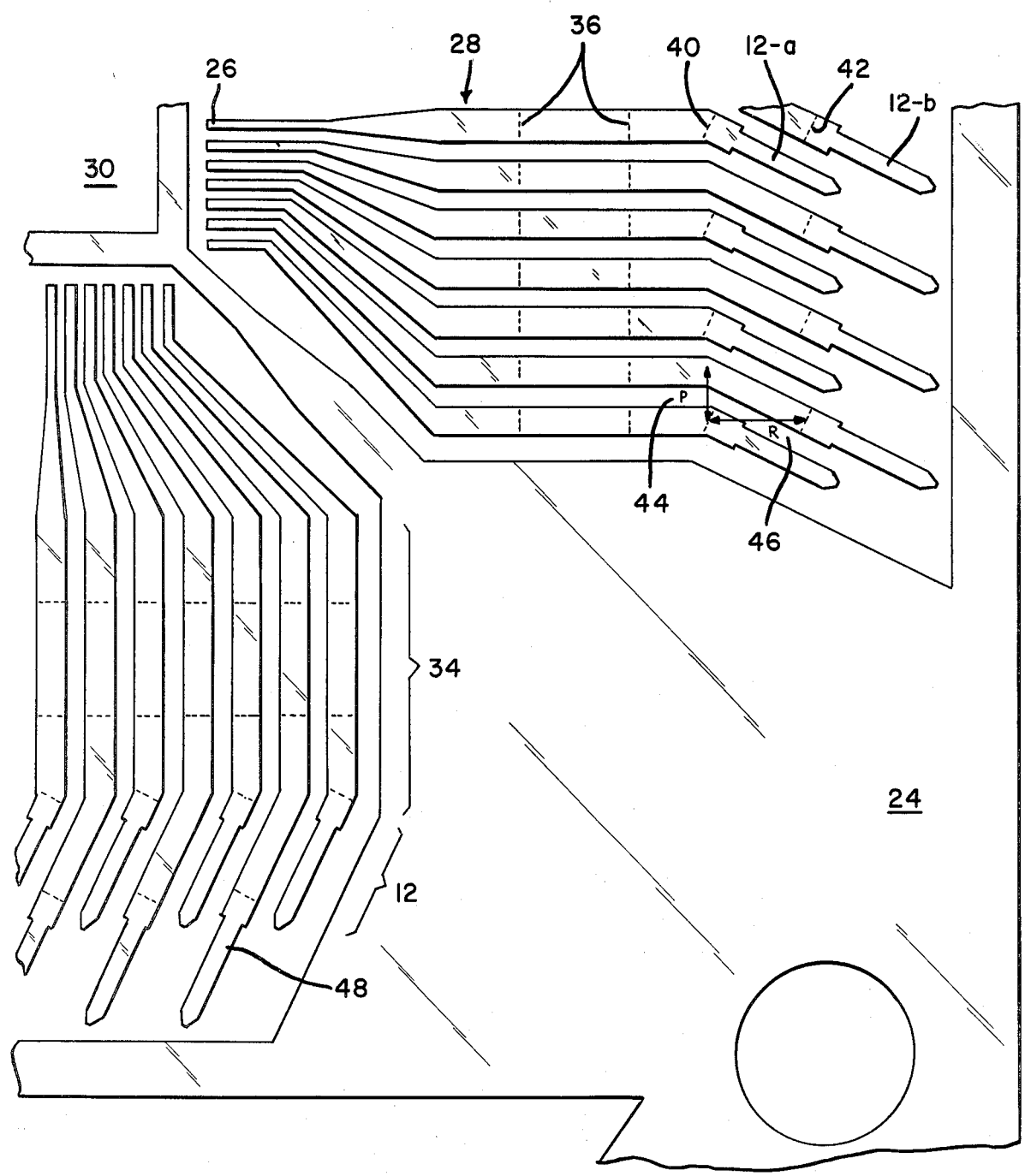
FIG. 4 is a top planar view showing the stamped lead frame in which the leads are positioned for being formed by the method of the present invention.

FIG. 1 shows a premolded chip carrier 10 having a plurality of legs 12; i.e., the outer ends of the leads on a lead frame which are inserted into a printed circuit board, formed such that there are two rows of such legs of each side of the carrier. This arrangement increases substantially the number of connections between a PCB 14 (FIG. 2) and the chip 16 in carrier 10 without taking up additional board real estate.

FIG. 3 shows the impossibility which results from attempting to stamp and form the legs or outer ends using right angle bends. The problem is that only one of the two legs shown can be stamped from a strip of material. The dashed lines on the drawing, called out by reference numerals 18 and 20, represent the dilemma. One can stamp out leg 18 or leg 20 but not both.

Referring to FIG. 4, the novel method of stamping and forming the leads to achieve the arrangement shown in FIG. 1 is clearly illustrated.

FIG. 4 is a drawing of one quadrant of a lead frame 22 partially stamped out from a coplanar strip of conductive material 24. The inner ends 26 of the individual leads 28 are adjacent the frame's central pad 30. Referring back to FIG. 1 for a moment, the inner ends 26 are shown therein as receiving the wires 32 from chip 16.

The several segments of each individual lead 28 include the previous mentioned inner end 26, a midsection 34 and the outer ends 12.

The leads on each side are stamped so that there are short outer ends 12-a alternating with long outer ends 12-b.

As is apparent from FIG. 4, outer ends 12 extend obliquely away from midsections 34.

Subsequent to stamping the lead frames as shown in FIG. 4, a chip 16 may be secured to center pad 30, wires attached between the chip and ends 26, the excess material of strip 24 cut away and the chip and frame molded into a package. The method for this operation is disclosed in U.S. Pat. No. 4,079,511.

Following the molding phase, leads 28 are formed or bent into the shape shown in FIG. 1. The first two forming steps are the two bends along dashed lines 36 located in midsections 34 (FIG. 4). These two bends bring the leads around the sides of the molded package, such package being designated by reference numeral 38 in FIG. 1. At that point outer ends 12-a and 12-b are parallel (not shown) to the plane of the bottom surface of the package. The final steps are bending the outer ends along dashed line 40 on short outer ends 12-a and along dashed line 42 on long outer ends 12-b. Note that line 40 is at the junction between the short outer end 12-a and midsection 34 and that line 42 is outwardly from that junction on long outer ends 12-b. The leads are now in the form shown in FIG. 1. By making the bends at dashed lines 40 and 42, the portion of the outer ends which enter the circuit boards; i.e., the "legs", are equal in length. Further, the legs on each side are in two parallel rows with the legs in one row in a direct line with the legs in the other row.

As noted above, the outer ends 12-a and 12-b are at an angle relative to midsection 34. The angle is determined from two dimensions: the length "P" indicated by reference numeral 44 in FIG. 4, and the length "R", indicated by reference number 46. "P" is the distance between center lines on adjacent leads. "R" is the distance from dashed line 40 on short outer end 12-a to dashed line 42 on long outer end 12-b. The angle then is the reciprocal of the tangent P over R.

The method disclosed above is not limited to having two rows of "legs" per side. The method provides a means for having any number of rows.

As will be recognized, "R" is the distance between the back to back holes on the circuit board. FIG. 2 shows this distance.

The outer ends 12 shown in FIG. 4 differ from the "legs" shown in FIGS. 1 and 2 in that the former include a shoulder 48 which provides a stop so that a space is provided between the package and circuit board. Providing a stop is an optional, well known structural feature and is not a part of the present invention.

What is claimed is:

1. A method of forming a lead frame comprising the steps of:
   a. stamping out a flat lead frame having a center pad and a plurality of leads extending outwardly from one or more sides thereof, every other lead consisting of an inner end adjacent the center pad, a long outer end and a midsection intermediate the inner and outer ends and the leads in between the every other lead consisting of an inner end adjacent the center pad, a short outer end and a midsection intermediate the inner and outer ends, further said outer ends of all leads being stamped out to extend obliquely away from the midsection,
   b. forming one row of legs along a first side of the center pad by perpendicularly bending the short outer ends where the midsections and outer ends join; and
   c. forming a second row of legs spaced from and parallel to the first row of legs by perpendicularly bending the long outer ends at a predetermined distance outwardly from where the midsection and outer ends join.

2. The method of claim 1 wherein the angle that the legs are formed relative to the midsections is the reciprocal of the tangent of the distance between the center line of adjacent leads over the distance between the points of bending between adjacent leads as set forth above in steps b and c.

3. A chip carrier having a lead frame formed by the method of claim 1.

* * * * *